United States Patent
Colombi et al.

(10) Patent No.: US 9,588,182 B2
(45) Date of Patent: Mar. 7, 2017

(54) SYSTEMS, METHODS, AND DEVICES FOR CAPACITANCE ESTIMATION OF POWER CAPACITORS

(71) Applicant: General Electric Company, Schenectady, NY (US)

(72) Inventors: Silvio Colombi, Ticino (CH); Marco Crespan, Cantello (IT)

(73) Assignee: General Electric Company, Schenectady, NY (US)

( * ) Notice: Subject to any disclaimer, the term of this patent is extended or adjusted under 35 U.S.C. 154(b) by 1083 days.

(21) Appl. No.: 13/738,688

(22) Filed: Jan. 10, 2013

(65) Prior Publication Data

US 2014/0012522 A1    Jan. 9, 2014

(30) Foreign Application Priority Data

Jul. 6, 2012  (IT) ............................... MI2012A1191

(51) Int. Cl.
G01F 22/02    (2006.01)
G01R 31/36    (2006.01)
(Continued)

(52) U.S. Cl.
CPC ....... *G01R 31/3624* (2013.01); *G01R 31/028* (2013.01); *G06F 17/10* (2013.01); *G01R 31/42* (2013.01)

(58) Field of Classification Search
USPC ......................................................... 702/50
See application file for complete search history.

(56) References Cited

U.S. PATENT DOCUMENTS

2006/0164782 A1   7/2006  Colombi
2006/0192628 A1*  8/2006  Schulman ............ A61N 1/3787
                                                              333/17.1
(Continued)

FOREIGN PATENT DOCUMENTS

EP    0652445 A2    5/1995
EP    0747715 A2    12/1996
(Continued)

OTHER PUBLICATIONS

Gustavo Brunello in Shunt Capacitor Bank Fundamentals and Protection, 2003 Conference for Protective Relay Engineers—Texas A&M University Apr. 8-10, 2003, College Station (TX) , :< URL: http://store.gedigitalenergy.com/faq/documents/general/shunt.pdf.*
Shanmuga S. Pandian, A physical analogy for ac electrical power, Dec. 10, 2003, 6 pages.*
Search Report and Written Opinion from corresponding Italian Application No. MI20121191, dated Mar. 1, 2013.
(Continued)

*Primary Examiner* — Tung Lau
(74) *Attorney, Agent, or Firm* — Fletcher Yoder P.C.

(57) ABSTRACT

Systems, methods, and devices are provided for estimating when preventive maintenance of power capacitors is called for. Such a system may include, for example, a voltage sensor, a current sensor, and data processing circuitry. The voltage sensor may measure a voltage difference across a phase of a power capacitor. The current sensor may measure a current across the phase of the power capacitor. The data processing circuitry to determine a first instantaneous indication of a difference between a nominal capacitance of the power capacitor and an actual value of the power capacitor based at least in part on the measured first voltage difference and first current.

20 Claims, 5 Drawing Sheets

(51) Int. Cl.
*G01R 31/02* (2006.01)
*G06F 17/10* (2006.01)
*G01R 31/42* (2006.01)

(56) References Cited

U.S. PATENT DOCUMENTS

2008/0291593 A1* 11/2008 Day .................... H02H 7/06
 361/78
2009/0112493 A1* 4/2009 Abdennadher .... G01R 27/2605
 702/58

FOREIGN PATENT DOCUMENTS

EP 2056116 A1 5/2009
WO 2008067787 A1 6/2008

OTHER PUBLICATIONS

Abdennadher, K et al., "A Real Time Predictive Maintenance System of Aluminium Electrolytic Capacitors Used in Uninterrupted Power Supplies", Industry Applications Society Annual Meeting, Oct. 5, 2008, IEEE, pp. 1-6, XP031353895, ISBN: 978-1-4244-2278-4.
Lee, D-C, et al., "Online capacitance estimation of DC-link electrolytic capacitors using recursive least squares method", IEEE Proceedings: Electric Power Applications, Institution of Electrical Engineers, vol. 152, No. 6, 4 Nov. 4, 2005, pp. 1503-1508, XP006025429, ISSN: 1350-2352.
Imam, A.M. et al., "Condition Monitoring of Electrolytic Capacitor in Power Electronic Circuits using Adaptive Filter Modeling", Power Electronics Specialists Conference, IEEE 36th, Jun. 12, 2005, pp. 601-607, XP010883269, ISBN: 978-0-7803-9033-1.

* cited by examiner

SYSTEMS, METHODS, AND DEVICES FOR CAPACITANCE ESTIMATION OF POWER CAPACITORS

CROSS-REFERENCE TO RELATED APPLICATIONS

This application claims the benefit of and priority to Italian Patent Application No. MI2012A001191, filed on 6 Jul. 2012, which is incorporated by reference herein in its entirety.

BACKGROUND OF THE INVENTION

The present disclosure relates to estimating capacitance of capacitors used in power electronic systems.

Modem power electronic systems, such as uninterruptible power supplies (UPSs), use switched converters coupled with LC filters to remove high-frequency components. Alternating current (AC) power capacitors are a major component of these filters. The limited life of a power capacitor usually requires preventive maintenance. Conventionally, timing for preventive maintenance for a power capacitor is estimated based on the stress imposed upon the capacitor, such as voltage, current, and temperature. Although estimating capacitor life in this way generally may be accurate, some power capacitors may contain unexpected defects or may age more quickly than most. Since the total capacitance of each phase of an AC power capacitor bank typically includes several capacitors connected in parallel, it is possible that at least one capacitor could have such a defect. As such, estimating capacitor life according to conventional techniques might inaccurately gauge when preventive maintenance should be scheduled. If proper preventive maintenance is not carried out—or if one capacitor malfunctions unexpectedly—there could be a high risk of failure of the power electronic equipment.

BRIEF DESCRIPTION OF THE INVENTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In a first embodiment, a system includes, for example, a voltage sensor, a current sensor, and data processing circuitry. The voltage sensor may measure a voltage difference across a phase of a power capacitor. The current sensor may measure a current flowing into the power capacitor. The data processing circuitry to determine a first instantaneous indication of a difference between a nominal capacitance of the power capacitor and an actual value of the power capacitor based at least in part on the measured first voltage difference and first current.

In a second embodiment, an apparatus includes an article of manufacture that includes tangible, machine-readable media storing machine-executable instructions. The instructions include instructions to receive a first, second, and third voltage measurements respectively across a first, second, and third phase of a power capacitor and a total current measurement equal to the sum of all currents flowing through the first, second, and third phases of the power capacitor. Other instructions may determine first, second, and third expected currents by multiplying nominal capacitance values of the first, second, and third phases of the power capacitor by a derivative of the first, second, and third voltage measurements. The instructions may also include instructions to sum the first, second, and third expected currents to obtain a total expected current and to compare the total expected current to the total current measurement to obtain an error signal related to differences between actual and nominal values of the power capacitor phases relative to one another.

In a third embodiment, a method includes measuring an instantaneous voltage and current associated with a phase of a power capacitor using a voltage sensor and a current sensor. Using a processor, an instantaneous error signal may be determined based at least partly on the measured instantaneous voltage and current. The instantaneous error signal may be related to a difference between an actual capacitance and a nominal capacitance of the power capacitor. When the instantaneous error signal or a value related to the instantaneous error signal exceeds a threshold, the processor may output an indication that preventive maintenance on the power capacitor is called for.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

The present disclosure relates to estimating the capacitance of capacitors used in power electronic systems. As used herein, a capacitor used in power electronic systems may be referred to interchangeably as a "power capacitor" or a "bank of power capacitors." These terms are not meant to be exclusive of one another. According to the present disclosure, when preventive maintenance for a power capacitor is called for may be determined with measures other than the mere estimated life of the capacitor based on current, temperature, operating time, and so forth. By monitoring electrical measurements associated with a power capacitor—in some cases, in real time or near real time—preventive maintenance may be properly scheduled. Indeed, the system of the present disclosure may even identify unexpected failures or defects in a capacitor that might be unaccounted for using conventional techniques.

Figure 1:
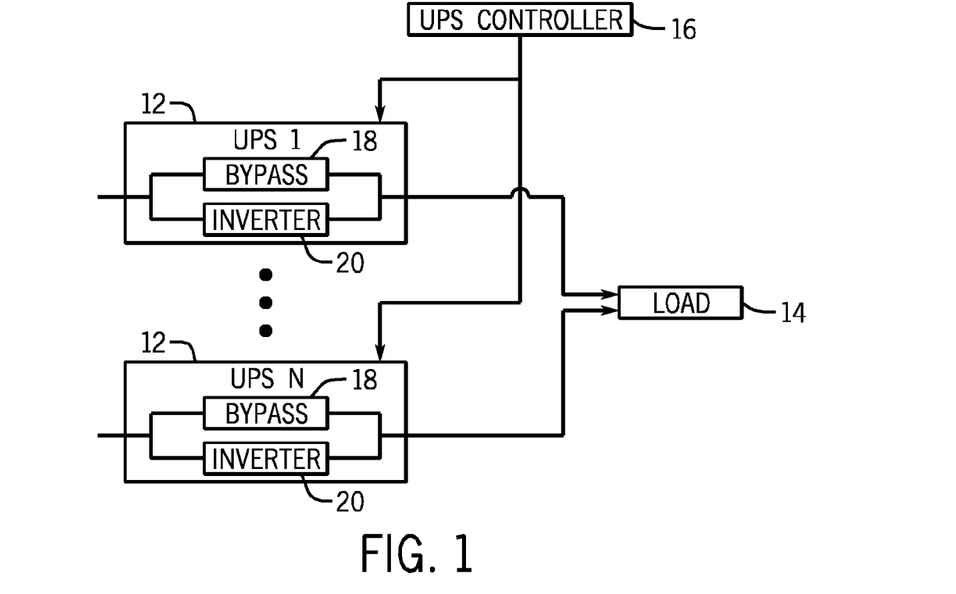
FIG. 1 is a block diagram of an uninterruptible power supply (UPS) system using capacitors monitored to identify errors, in accordance with an embodiment.

Many different types of power electronic systems may use capacitors or banks of capacitors in alternating current (AC) filtering circuits. One such type of power electronic systems may include, for example, an uninterruptible power supply (UPS) system 10, as generally illustrated in FIG. 1. Although the following disclosure will describe estimating the lifetime of a capacitor in the context of the UPS system 10, the UPS system 10 is intended to represent only one form of power electronic system that can benefit from the present disclosure. Indeed, any power electronic system that using a power capacitor may employ the systems, methods, and devices taught by the present disclosure.

The UPS system 10 includes any suitable number of uninterruptible power supplies (UPSs) 12, here labeled 1 ... N, which may feed power to a load 14. One or more UPS controllers 16 may control the operation of the UPSs 12 in the manner described below. Although the example of FIG. 1 illustrates a single UPS controller 16 that may control all of the UPSs 12 of the parallel UPS system 10, other configurations may be employed. Alternatively, for example, each UPS 12 may rely on its own UPS controller 16, which may coordinate with other UPS controllers 16 in any suitable fashion (e.g., peer-to-peer or master-slave).

Among other things, the UPS controller 16 may determine and control when each UPS 12 supplies power to the load 14 by way of a bypass feed path 18 or an inverter feed path 20. The bypass feed path 18 of each UPS 12 represents power supplied from some main power source, such as a power utility or local generator. In contrast, the inverter feed path 20 represents a double-conversion path in which alternating current (AC) power is first converted to direct current (DC) before being converted again to AC power using an inverter. As will be discussed below, the UPS controller 16 may also monitor and identify when preventive maintenance is called for in a power capacitor or bank of power capacitors. This technique may apply to any suitable type of UPS (e.g., line interactive, double conversion, etc.) and also to any power electronic system using AC capacitors (e.g., wind converter, drive converter, etc.)

Figure 2:
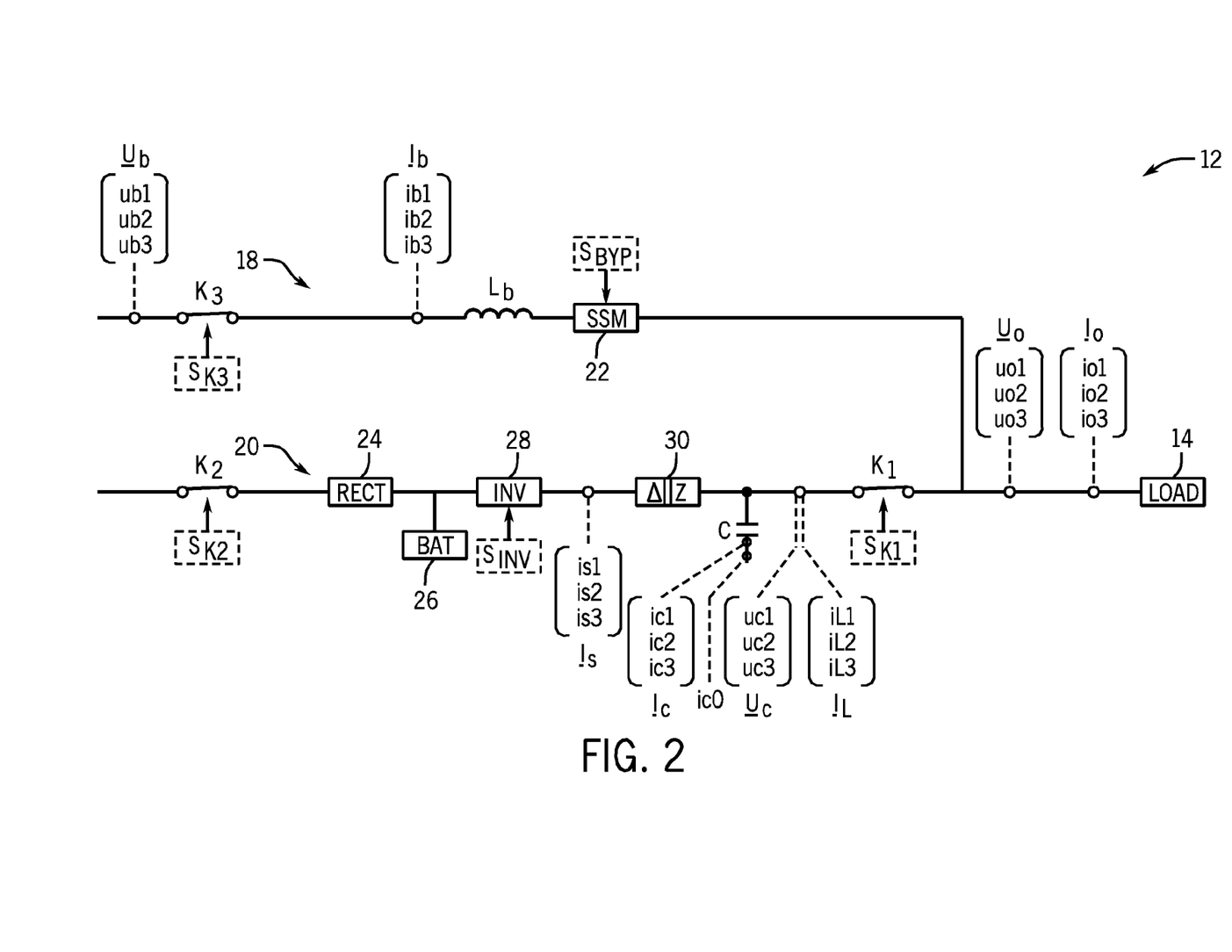
FIG. 2 is a block diagram illustrating various electrical measurements and control signals in the UPS system, in accordance with an embodiment.

To control each UPS 12 and identify when preventive maintenance for a power capacitor of the UPS 12 is called for, the UPS controller 16 may receive electrical measurements at various points within the UPS 12 and provide several control signals to components of the UPS 12. Some of these signals are shown in a block diagram of a UPS 12 illustrated in FIG. 2. In the example of FIG. 2, a block diagram of a UPS 12 is shown in one-line form. That is, each line of the block diagram of FIG. 2 represents three phases of power (and/or a neutral line). As also can be seen in FIG. 2, the UPS 12 includes a bypass feed path 18 and an inverter feed path 20.

Referring first to the bypass feed path 18, a contactor or switch $k_3$ provides power from the power source through the bypass feed path 18 when closed. A control signal $S_{K3}$ from the UPS controller 16 may control whether the contactor or switch $K_3$ is open or closed. In general, the contactor or switch $K_2$ remains closed even when the bypass feed path 18 is not selected to provide power to the load 14. An inductor $L_b$ serves as a choke in each UPS 12. The presence of the inductor $L_b$ in the bypass feed path 18 may permit accurate electrical measurements in the bypass feed path 18 even when connected in parallel with other UPSs 12. As shown in FIG. 2, voltage measurements ($U_b$) and current measurements ($I_b$) of the bypass feed path 18 may be measured before the inductor $L_b$. Without the inductor $L_b$, a failure (e.g., a short circuit) in a different parallel bypass feed path 18 could immediately impact the measurements of the bypass feed path 18 shown in FIG. 2. A static switch module (SSM) 22 in the bypass feed path 18 may act as a switch controlled by the UPS controller 16 (e.g., via a control signal $S_{BYP}$). As should be appreciated, the SSM 22 may be formed from cost- and power-efficient thyristors. The UPS controller 16 may control whether the bypass feed path 18 supplies power to the load 14 by toggling the SSM via the control signal $S_{BYP}$.

The inverter feed path 20 may receive power through a contactor or switch $K_2$. The UPS controller 16 may control the contactor or switch $K_2$ via a control signal $S_{K2}$. In general, the contactor or switch $K_2$ will remain closed even when the inverter feed path 20 is not selected to provide power to the load 14. Three-phase power passing through the inverter feed path 20 may enter a rectifier 24. The rectifier 24 converts alternating current (AC) power into direct current (DC) power. The DC power output by the rectifier 24 may be stored in a battery 26 or any other suitable energy storage device. When the inverter feed path 20 supplies power to the load 14, an inverter 28 may reconvert the DC power from the rectifier 24 and/or the battery 26 back to AC power based on inverter control signals $S_{INV}$. The UPS controller 16 may control whether the inverter feed path 20 supplies power to the load 14 based on the inverter control signals $S_{INV}$ the inverter 28 receives (or does not receive). The AC power output by the inverter 28 may enter an output isolation transformer 30 before reaching three-phase power capacitor C.

As discussed above, the controller 16 may receive several electrical measurements of the UPS 12. For example, voltage measurements ($U_b$) and current measurements ($I_b$) of the bypass feed path 18 may be measured. In the inverter feed path 20, output currents ($I_s$) from the inverter 28 are sensed between the inverter 28 and the output isolation transformer 30. Additionally, capacitor voltage ($U_c$) and inverter load current ($I_L$) may be measured before the contactor or switch $K_1$. At the output of the UPS 12, amounting to the combination of power from the bypass feed path 18 and the inverter feed path 20, output voltage ($U_o$) and output current ($I_o$) may be measured. These measurements may be used to control the power flow through the UPS 12.

The controller 16 may also receive capacitor currents $I_C$ and/or $i_{C0}$ to estimate when preventive maintenance on the power capacitor C is called for. The capacitor current vector $I_C$ contains the three instantaneous currents respectively flowing through the power capacitor C (e.g., see FIG. 4 and the associated discussion below). The capacitor current $i_{C0}$ represents the sum of the three capacitor currents contained in $I_C$, which may be measured as the current output to neutral from the power capacitor C. As will be discussed below, only one or the other of the capacitor currents $I_C$ and/or $i_{C0}$ may be used to perform this estimation. As such, other embodiments may include current sensors only to measure the capacitor currents $I_C$ or only the capacitor current $i_{C0}$.

Figure 3:
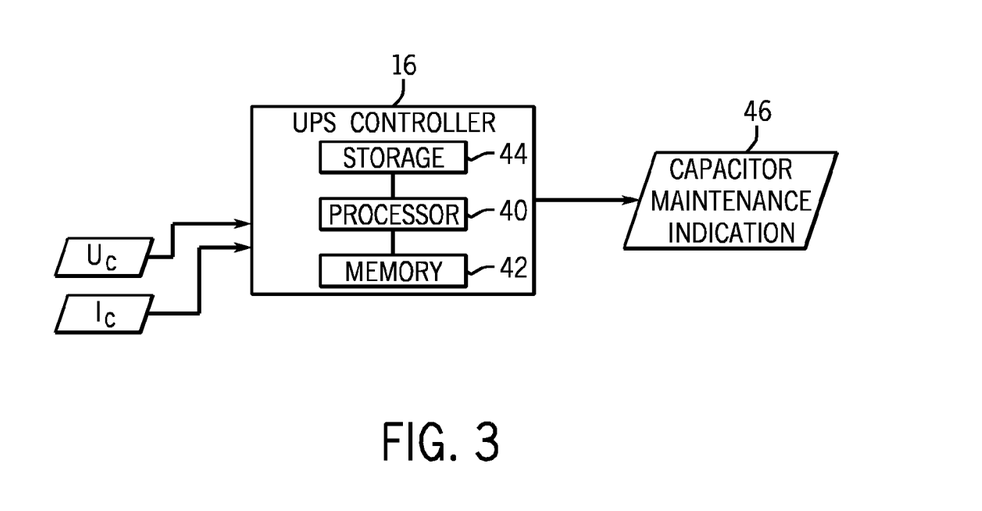
FIG. 3 is a block diagram of a controller that can indicate when capacitor maintenance is called for using some of the electrical measurements of FIG. 2, in accordance with an embodiment.

As seen in FIG. 3, the UPS controller 16 may receive at least the measurement $U_c$ and either or both of the currents $I_C$ or $i_{C0}$. Using these measurements, the UPS controller 16 may determine when preventive maintenance on the power capacitor C is called for. To do so, the UPS controller 16 may employ a processor 40 operably coupled to memory 42 and/or storage 44. The processor 40 and/or other data processing circuitry may carry out instructions stored on any suitable article of manufacture having one or more tangible, machine-readable media at least collectively storing such instructions. The memory 42 and/or storage 44 may represent such articles of manufacture. Among other things, the memory 42 and/or the storage 44 may represent random-access memory, read-only memory, rewriteable memory, a hard drive, or optical discs. Additionally or alternatively, the UPS controller 16 may include a field programmable gate array (FPGA) or an application-specific integrated circuit (ASIC) that has been programmed to carry out the techniques discussed herein or to support the processor 40 (e.g., by assisting in communication). Using the techniques discussed below, the UPS controller 16 may output a capacitor maintenance indication 46 when the instantaneous measurements $U_c$ and $I_C$ and/or $i_{C0}$ indicate preventive maintenance is called for.

Figure 4:
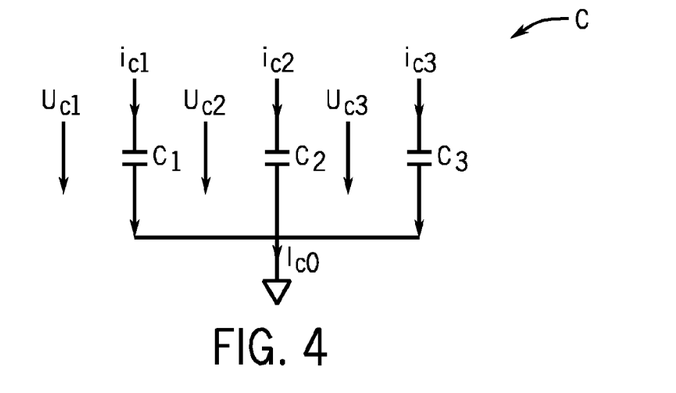
FIG. 4 is a circuit diagram of a three-phase capacitor bank, in accordance with an embodiment.

When the UPS 12 is a three-phase system, as generally illustrated in FIG. 2, the capacitor bank C may include three distinct banks of capacitors as generally illustrated in FIG. 4. For example, a first group of capacitors $C_1$ may have a total voltage difference of $u_{c1}$ and may pass a current of $i_{c1}$. A second group of capacitors $C_2$ may have a total voltage difference of $u_{c2}$ and may pass a current of $i_{c2}$. Finally, a third group of capacitors $C_3$ may have a total voltage difference of $u_{c3}$ and may pass a current of $i_{c3}$. The currents $i_{c1}$, $i_{c2}$, and $i_{c3}$ represent the current measurement $I_C$ and may add to one another to create a total output current to neutral of $i_{C0}$. The capacitor banks $C_1$, $C_2$, and $C_3$ may be respectively built using banks of several capacitors connected in parallel. Typically, though not necessarily, the capacitor banks $C_1$, $C_2$, and $C_3$ may have the same rated, or nominal, capacitance. The nominal capacitance may change as the capacitors age, however, and thus may be used to determine when preventive maintenance is called for. As will be discussed below, some of the embodiments discussed below may identify when the actual capacitances of the capacitor banks $C_1$, $C_2$, and $C_3$—estimated using the electrical measurements $U_c$ and $I_C$—differ by too great an amount from the rated or nominal capacitances. Additionally or alternatively, a non-uniform change in the capacitance of the capacitor banks $C_1$, $C_2$, and/or $C_3$—estimated using the measurements $U_c$ and $i_{C0}$—may indicate a defect in at least one of the three capacitor banks that warrants attention.

As should be appreciated, the voltages $u_{c1}$, $u_{c2}$, and $u_{c3}$ respectively relate to the currents $i_{c1}$, $i_{c2}$, and $i_{c3}$ and capacitances $C_1$, $C_2$, and $C_3$ according to the following equation in differential or integral form:

$$i_c = C \frac{du_c}{dt} \leftrightarrow u_c = u_{c0} + \frac{1}{C}\int i_c dt. \tag{1}$$

In Equation 1 above, C refers to the value of capacitance of the capacitor. The above relationship may be used to estimate a likely actual value of capacitance given the measured electrical values. The likely actual capacitance value may be compared to the rated capacitance to obtain an error value that can indicate preventive maintenance is called for.

Figure 5:
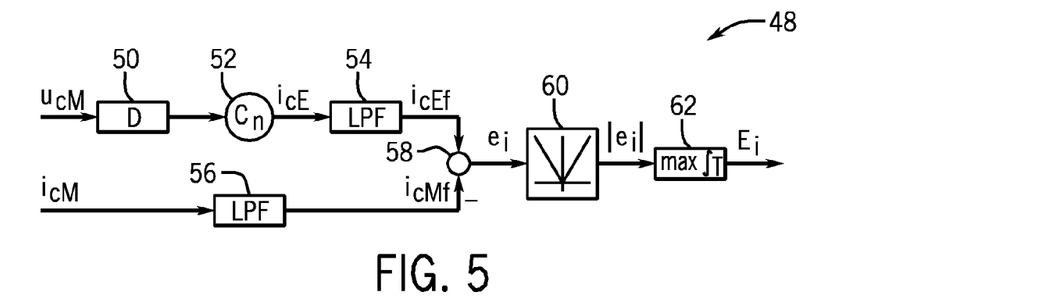
FIG. 5 is a control system that can identify an error between the expected capacitance of a capacitor and the likely actual capacitance of the capacitor, in accordance with an embodiment.

To provide one example, FIG. 5 illustrates a system to determine a difference between the rated capacitance and actual capacitance of one phase of the power capacitor C. In particular, FIG. 5 illustrates a block diagram 48 that may be implemented by the controller 16 in determining when preventive maintenance is called for. In particular, the rated capacitance of a capacitor may not accurately reflect the actual capacitance of the capacitor, particularly if the capacitor is defective or has gradually degraded over time. The block diagram 48 of FIG. 5 may determine a measure of the difference in these values, which may indicate when preventive maintenance is called for. It should be appreciated that the system of FIG. 5 may be carried out by the controller 16 in the form of executable instructions and/or specialized circuitry.

In the example of FIG. 5, a measured value of voltage across one phase of the capacitor C (e.g., voltage $u_{c1}$ across capacitor $C_1$) may enter a derivative block 50. As will be described below, the derivative block 50 may employ a state controller to obtain an estimate of the derivative of a higher order than a simple first-order estimate. The output of the derivative block 50 is multiplied by the rated capacitance $C_n$ 52, also referred to as the nominal capacitance, to produce an expected current value $i_{cE}$. To reduce the impact of high-frequency components, the high-frequency components of the expected current $i_{cE}$ may be filtered in a low pass filter 54 to produce a filtered expected current $i_{cEf}$. This expected current $i_{cEf}$ represents an instantaneous value of current that is expected to be flowing across the phase of the capacitor $C_i$ (e.g., $C_1$) when the actual capacitance of the capacitor $C_i$ is the same as the rated capacitance or nominal capacitance $C_n$.

When the rated capacitance or nominal capacitance of the capacitor $C_i$ (e.g., $C_1$) is the same as the actual capacitance, the expected current $i_{cE}$ (or the filtered expected current $i_{cEf}$) would be expected to be substantially the same as the measured current $i_{cM}$ (e.g., a measured value of $i_{c1}$, $i_{c2}$, or $i_{c3}$). The actual and rated capacitances may differ, however, and thus the expected current $i_{cE}$ (or the filtered expected current $i_{cEf}$) may differ from the measured current $i_{cM}$ in a predictable manner. To facilitate such a comparison, the measured current $i_{cM}$ may be passed through a low pass filter (LPF) 56 to obtain a filtered measured current $i_{cMf}$. The low pass filters (LPFs) 54 and 56 may be substantially the same or may be different, but both generally may introduce the same amount of delay to their respective values. To name a few examples, the low pass filters (LPFs) 54 and 56 may remove noise with a frequency of greater than the fundamental frequency (e.g., $\frac{1}{50}$s or $\frac{1}{60}$s). Phase delay resulting from the LPFs 54 and 56 may be cause minimal problems because the low pass filters (LPFs) 54 and 56 may introduce the same amount of delay to their respective signals.

Comparing the expected filtered current $i_{cEf}$ with the measured current $i_{cMf}$ in a comparator 58 produces an error signal $e_i$. In general, the error signal $e_i$ relates a difference between the rated or nominal capacitance and the actual capacitance of the phase of the power capacitor C upon which the electrical measurements $u_{cM}$ and $i_{cM}$ have been obtained. The error value $e_i$ may pass through a magnitude block 60 to obtain the absolute value of the error signal $|e_i|$. The absolute value of the error signal $|e_i|$ may be integrated in an integration block 62 over a period T, which may be equal to the fundamental period of the phase of power associated with the capacitor $C_i$ (e.g., $C_1$) (e.g., $\frac{1}{50}$s or $\frac{1}{60}$s). The resulting value $E_i$ is a measure of the difference between the rated or nominal values and the actual value of the capacitance of the phase of the power capacitor.

Figure 6:
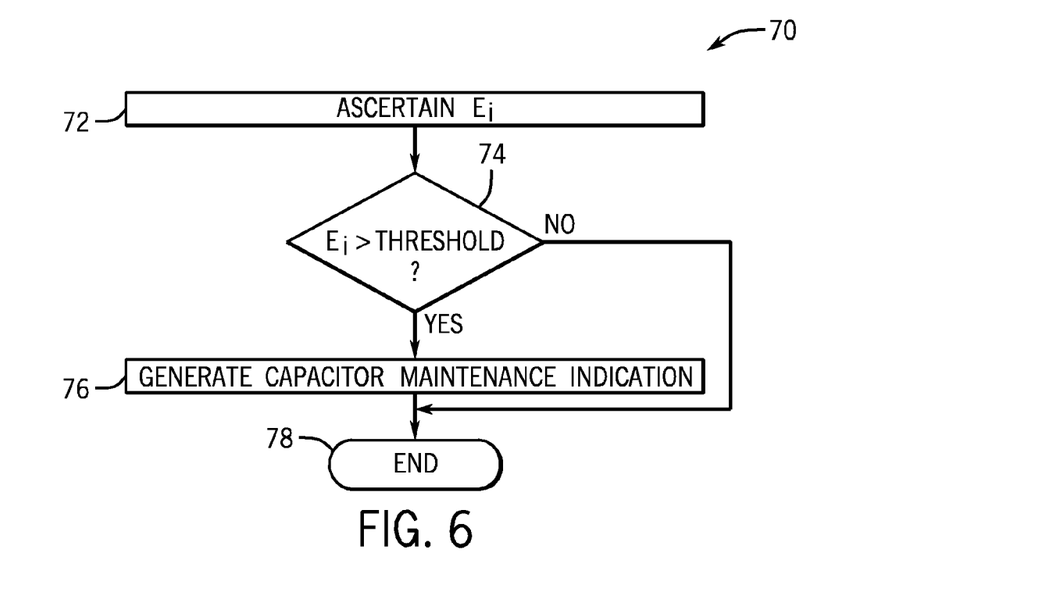
FIG. 6 is a flowchart describing a method for indicating when capacitor maintenance is called for based on the error determined using the system of FIG. 5, in accordance with an embodiment.

As illustrated by a flowchart 70 of FIG. 6, the controller 16 may provide the preventive maintenance indication 46 when the difference between the rated or nominal capacitance and the actual capacitance of a phase of the power capacitor $C_i$ (e.g., $C_1$, $C_2$, and/or $C_3$) goes beyond an acceptable amount. The controller 16 may carry out the actions of the flowchart 70 periodically or upon demand. In one example, the flowchart 70 may be carried out approximately every few seconds or less, such that the error signal $E_i$ may be obtained in real time or near real time. When the controller 16 performs the actions of the flowchart 70 in real time or near real time, the controller 16 may be able to respond in real time or near real time to unexpected errors.

The flowchart 70 may begin when the controller 16 ascertains the error signal value $E_i$ (block 72). The controller 16 may ascertain the error signal value $E_i$ in the manner discussed above with reference to FIG. 5 or as discussed below with reference to FIG. 9. When the error signal $E_i$ exceeds some threshold value (decision block 74), the controller 16 may generate the capacitor maintenance indication 46 (block 76). The controller 16 may also generate alarms or other alerts depending on the severity of the size of the value $E_i$. Otherwise, if the error signal $E_i$ falls within the threshold (decision block 74), the controller 16 may take no action or may indicate that the value of the capacitor $C_i$ (e.g., $C_1$, $C_2$, and/or $C_3$) remains within an acceptable range.

Figure 7:
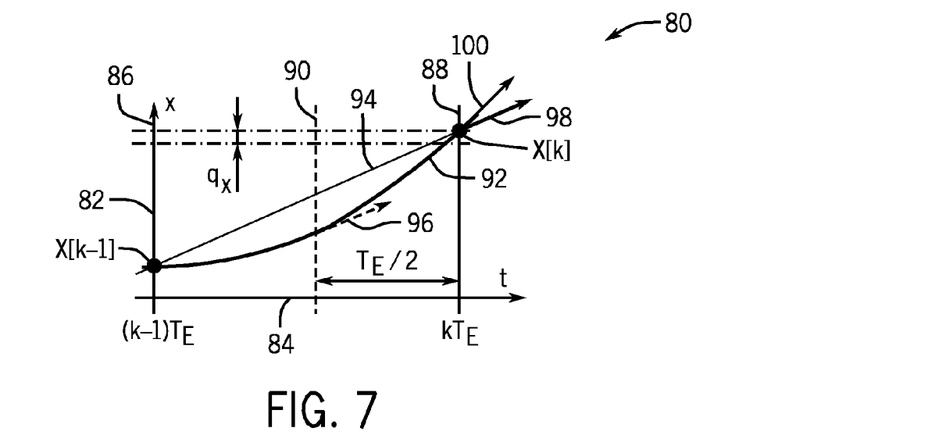
FIG. 7 is a plot providing an example of a first-order manner of estimating a derivative, in accordance with an embodiment.

As alluded to above, the controller 16 may obtain the derivative of the measured voltage across the capacitor $u_{cM}$ using a technique of a higher-order than first-order estimation. Namely, as generally shown in FIG. 7, a first-order estimate of a derivative may be insufficiently accurate—that is, when the signal variation is quadratic, a first-order estimation always introduces a delay of half a sampling time, irrespective of the sampling time. In the example of FIG. 7, a plot 80 illustrates a first-order estimate of a derivative of a value x (ordinate 82) over time (abscissa 84). FIG. 7 shows the variable x(t) sampled with a sampling time $T_E$. Thus, values of x are measured at times 86 (e.g., $(k-1)T_E$, or more generally $x[k-1]$) and 88 (e.g., $kT_E$, or more generally $x[k]$). From the two samples obtained at these times, the estimated derivative at the time $kT_E$ based on a linear interpolation can be express by the following equation:

$$\frac{dx^1}{dt}[k] \approx \frac{x[k] - x[k-1]}{T_E}. \quad (2)$$

As such, the value of the derivative is effectively obtained at a time 90, or the distance $T_E/2$. The actual curve x(t) is denoted as numeral 92. A first-order linear interpolation of x(t) is denoted as numeral 94. At the time 90, situated between the sampling times, a vector estimate 96 is accurate. Though the vector estimate 96 is accurate at the time 90, the same vector at numeral 98 is inaccurate at the time 88. Indeed, as compared to an accurate instantaneous derivative vector 100, which represents a higher-order derivative at the time 88, the first-order estimated vector 98 lags significantly. In other words, the derivative of x(t) based on equation 2 at the time $kT_E$ (vector 98) is delayed with respect to the true derivative (vector 100). In fact, the derivative based on the first order approximation (vector 98) introduces the following quantization error (q) and maximal delay error ($\tau$):

$$q_{\frac{dx}{dt}} = \frac{q_x}{T_E}; \quad (3)$$

$$\tau_{\frac{dx}{dt}} \approx \frac{T_E}{2}. \quad (4)$$

Figure 8:
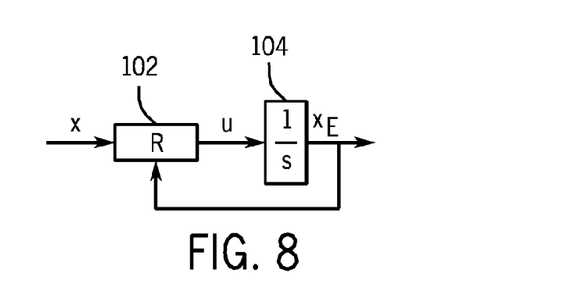
FIG. 8 is a block diagram of a system to determine a higher-order estimation of a derivative, in accordance with an embodiment.

For a better derivative, the controller 16 may employ a state controller R, as generally illustrated in FIG. 8. As shown in FIG. 8, the variable to be measured x (e.g., $u_{c1}$, $u_{c2}$, and/or $u_{c3}$) enters the state controller 102 along with an estimate $x_E$. The state controller R 102 is designed to output a command variable u (e.g., any suitable derivative estimate of the voltages $u_{c1}$, $u_{c2}$, and/or $u_{c3}$). Integrating the command variable u in an integration block 104 produces the feedback estimated value of $x_E$ (e.g., an estimated value of $u_{c1}$, $u_{c2}$, and/or $u_{c3}$ given the derivative). With this structure in mind, applying z-transform theory, one may obtain the following higher-order derivative estimate:

$$\frac{dx^2}{dt}[k] \approx \frac{2x[k] - 3x[k-1] + x[k-2]}{T_E}. \quad (5)$$

Figure 9:
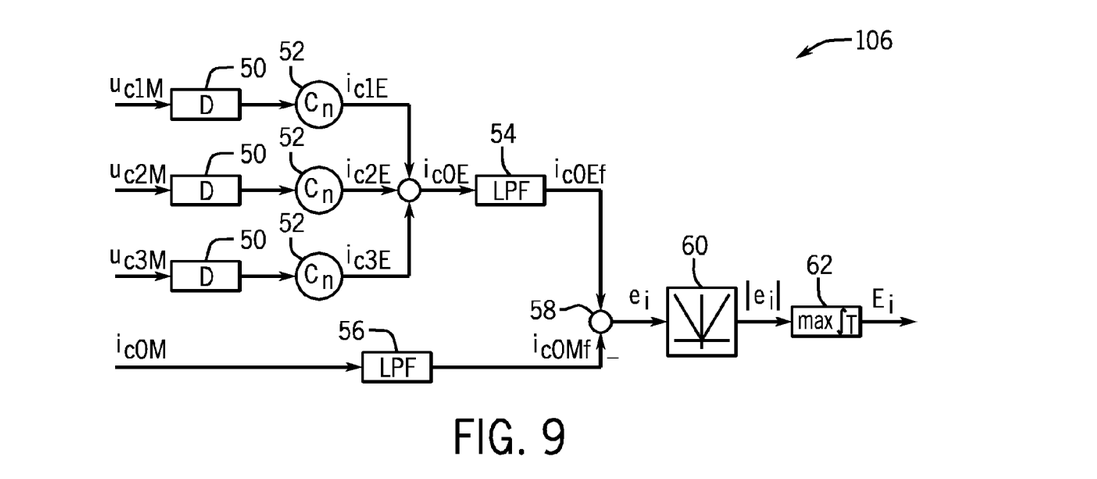
FIG. 9 is a block diagram of a control system to ascertain an error between an expected capacitance and an estimated measured capacitance, in accordance with an embodiment.

The derivative estimate provided by Equation 5 may be employed in the derivative block D 50 used in the capacitance error estimation of FIG. 5. An alternative manner of determining when preventive maintenance is called for as shown in FIG. 9, in which derivative blocks D 50 may also use the derivative estimate provided by Equation 5. In FIG. 9, a block diagram 106 provides a manner of ascertaining when some capacitor or capacitor bank in a three-phase power capacitor should undergo preventive maintenance. The block diagram 106 of FIG. 9 may rely on the same number of voltage sensors measurements (e.g., one across each of the three phases of the power capacitor C), but only one current sensor may be used (e.g., to determine the capacitor neutral current $i_{C0}$).

The block diagram 106 of FIG. 9 operates according to the same general principles of the block diagram 48 of FIG. 5. Thus, measured voltage values $u_{c1M}$, $u_{c2M}$, and $u_{c3}$ may enter respective derivative blocks 50 (which may employ Equation 5, discussed above). The respective outputs of the derivative blocks 50 may be multiplied by the rated capacitances 52 also refer to as nominal capacitances, to produce expected current values $i_{c1E}$, $i_{c2E}$, and $i_{c3E}$. These expected current values may be added together in a summation block 108 to produce an expected neutral current $i_{c0E}$, which may enter a low pass filter (LPF) 54 to produce a filtered expected neutral current $i_{c0Ef}$.

It should be appreciated that, when the voltage values on the respective phases of the power capacitor C are properly 120° out of phase from one another, and the actual capacitances of the three phases of the power capacitor C are the same (e.g., $C_1 = C_2 = C_3$) the total current output to neutral $i_{C0Ef}$ should be approximately zero. The measured output current neutral current $i_{c0}$ may be filtered through a low pass filter (LPF) 56 to produce a filtered measured neutral current $i_{C0Mf}$. The filtered measured neutral current $i_{C0Mf}$ may enter a comparator 58 with the filtered estimated neutral current $i_{C0Ef}$. The resulting error value $e_i$ may enter a magnitude block 60 that outputs an absolute value of the error signal $|e_i|$. The absolute value of the error signal $|e_i|$ may be integrated in an integration block 62 to produce an error signal $E_i$.

It should be noted that the block diagram 106 of FIG. 9 differs from the block diagram 48 of FIG. 5 in the number of current sensors employed. That is, when the block diagram 48 of FIG. 5 is applied to the three-phase power capacitor C as illustrated in FIG. 4, three current sensors are used—one to ascertain each current $i_{c1}$, $i_{c2}$, and $i_{c3}$. Using the three additional current sensors to measure the currents $i_{c1}$, $i_{c2}$, and $i_{c3}$ and the block diagram 48 of FIG. 5 may allow the detection of any variation in capacitance, including balanced variations on the three different phases. In practical power converter systems, however, multiple capacitors are connected in parallel to build the total capacitance required for each phase (e.g., $C_1$, $C_2$, and $C_3$). Thus, the probability of a uniform degradation in capacitance for multiple capacitors may be very low. As such, the block diagram 106 of FIG. 9 may suffice while using only one current sensor. The block diagram 106 of FIG. 9 thus may be more cost-efficient than the block diagram 48 of FIG. 5 without substantially sacrificing its protective advantages.

Figure 10:
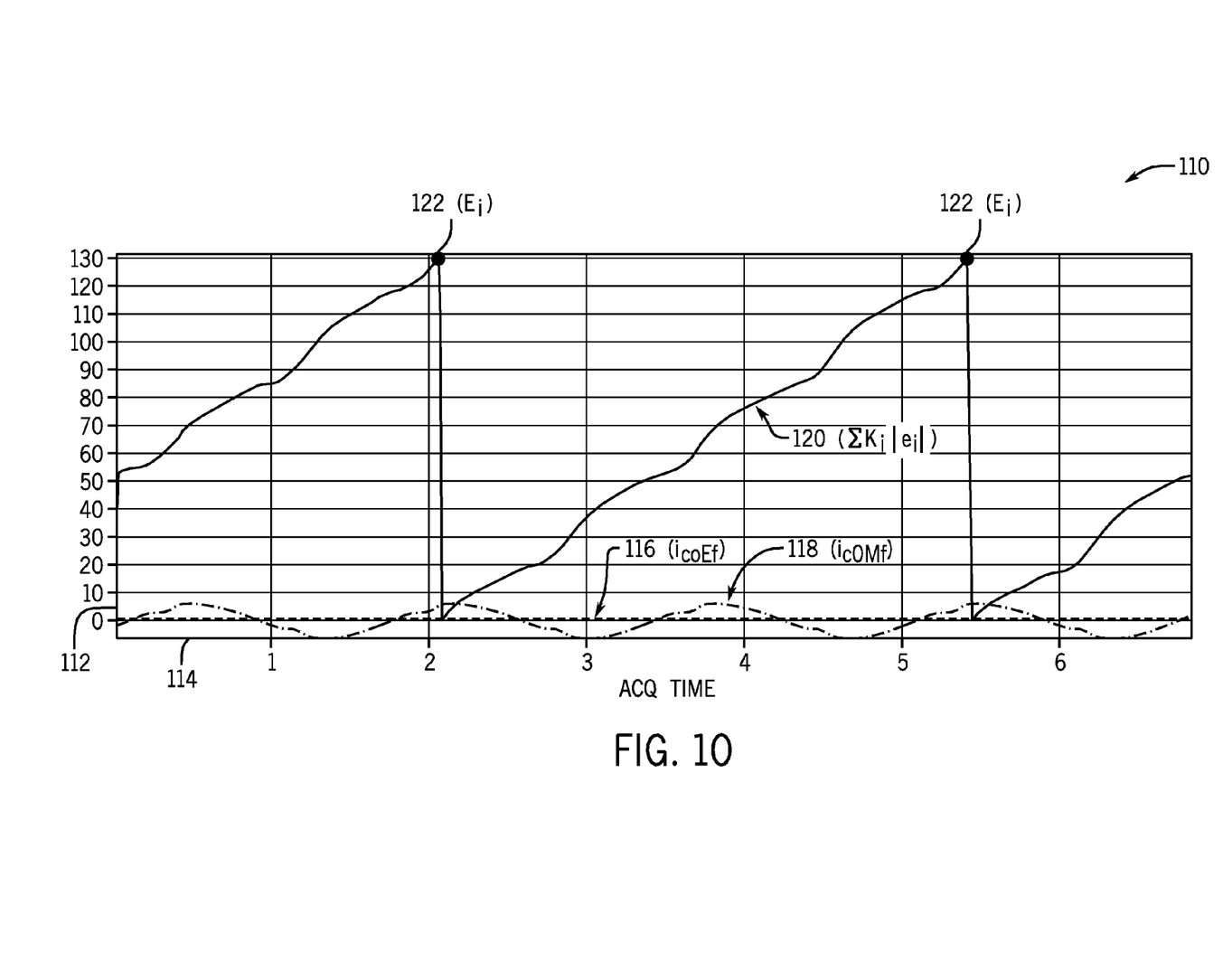
FIG. 10 is a plot illustrating experimental values obtained using the system of FIG. 9, in accordance with an embodiment.

An example of the operation of the block diagram 106 of FIG. 9 appears in a plot 110 of FIG. 10. The plot 110 of FIG. 10 represents experimental results obtained on a 750 kVA three-phase inverter filtered using three banks of capacitors in parallel to build a total capacitance of 1500 μF per phase. In the test upon which the plot 110 is based, the capacitance of one of the three phases was artificially increased by approximately 3%, leading to a detectable error. In the plot 110 of FIG. 10, an ordinate 120 represents an unbalanced index $E_i$ and an abscissa 114 represents time. Superimposed on the plot 110 error are curves 116 ($i_{c0Ef}$) and a measured neutral current $i_{c0Mf}$ (numeral 118).

As seen in the plot 110, when all three phases of the power capacitor all have the same nominal capacitance, the expected sum of the three phases of current $i_{c0Ef}$ (curve 116) through the power capacitor C are approximately zero. When one of the phases has a different actual capacitance, however, the measured total current $I_{c0Mf}$ (curve 118) changes with a periodicity related to the phase of power flowing thorough the unbalanced power capacitor phase. As such, a summation of the magnitude of the instantaneous error values $|e_i|$ (curve 120) reach a total of $E_i$ at the end of the period T, shown at points 122 on the plot 110. That is, the "unbalance index" $E_i$, in the example of FIG. 10 is shown to be 130 where the integration period T is equal to two fundamental periods and the capacitance of the unbalanced capacitor phase differs by approximately 3% from the other phases.

The examples provided above are not intended to be exclusive. In addition to determining—in real time, near real time, or less often—an error in a power capacitor that has been installed, the above-described systems and techniques may be employed in a quality control scenario. Indeed, it is possible that even a newly manufactured power capacitor may include latent defects that might be otherwise unknown. When the power capacitor is manufactured or received from a manufacturer, it may be tested in a manner discussed above before installation or additional manufacturing. In this way, a power capacitor that has unbalanced phases can be identified and remedied even before appearing at a customer location.

Indeed, a calibration can be made to keep into account the tolerance of the components as well as to filter out bad capacitors during the initial testing of new production units. For the capacitance estimation algorithm shown in the block diagram 48 of FIG. 5, for a single capacitor, it is possible to determine the initial variation in capacitance based on the unbalance index $E_i$ using the equation $$\Delta_C \% = 100 \frac{\eta E_i T_E}{8 \hat{U} K_i C_{nom}}, \quad (6)$$

where $T_E$ is the sampling time, $\hat{U}$ is the peak voltage, $K_i$ is the integration factor, $C_{nom}$ is the nominal capacitor value and the inverse of the attenuation factor of the low pass filter. Equation (6) assumes an integration period T equal to two fundamental periods.

For a three phase system, it is possible to apply the same equation for the three phases if three current sensors are used. If only one sensor is used, according to the system of FIG. 9, the situation is more complex. For the particular case where only one capacitor doesn't have the nominal capacitance, Equation 6 still applies. As an example, applying Equation 6 to the case of FIG. 10 ($E_i$=130, $T_E$=100 ms, $\hat{U}$=277*sqrt(2), $K_i$=0.1, $C_{nom}$=1500 μF, η=1.062), one obtains $\Delta_C$=2.94%, which corresponds to the artificial increase of capacitance added. In a general case, the calibration can be done in two different ways. The first method involves energizing one phase at a time during the initial testing of a new unit. This first method has the effect of virtually applying one current sensor per phase, and the ambiguity is thus removed. If this is not possible because of a coupling between the three phases (e.g., as typically may be created by a transformer), the calibration may involve a different procedure. For example, consider the circuit of FIG. 4, with the three capacitance values defined by:

$$\begin{cases} C_1 = C_{nom} + \Delta C_1 \\ C_2 = C_{nom} + \Delta C_2 \\ C_3 = C_{nom} + \Delta C_3. \end{cases} \quad (7)$$

If the following voltages are applied to the capacitors:

$$\begin{cases} u_{c1} = (U_{nom} + \Delta U_1)\cos(\omega t) \\ u_{c2} = (U_{nom} + \Delta U_2)\cos(\omega t - 2\pi/3) \\ u_{c3} = (U_{nom} + \Delta U_3)\cos(\omega t - 4\pi/3), \end{cases} \quad (8)$$

the total current $i_{C0}$ is given by:

$$i_{c0} = C_1 \frac{du_{c1}}{dt} + C_2 \frac{du_{c2}}{dt} + C_3 \frac{du_{c3}}{dt}, \quad (9)$$

and it is then a combination of the three capacitance unbalances $\Delta C_1$, $\Delta C_2$, $\Delta C_3$ (unknown) and of the three voltage unbalances $\Delta U_1$, $\Delta U_2$, $\Delta U_3$ (known). By doing three different tests in different conditions, for example:

$$\begin{cases} \text{test 1} & \Delta U_1 = \Delta U & \Delta U_2 = 0 & \Delta U_3 = -\Delta U \\ \text{test 2} & \Delta U_1 = -\Delta U & \Delta U_2 = \Delta U & \Delta U_3 = 0 \\ \text{test 3} & \Delta U_1 = 0 & \Delta U_2 = -\Delta U & \Delta U_3 = \Delta U, \end{cases} \quad (10)$$

one can obtain three different unbalance indexes $E_{i1}$, $E_{i2}$ and $E_{i3}$ that can be used to finally determine the three unknown capacitance unbalances $\Delta C_1$, $\Delta C_2$ and $\Delta C_3$.

Technical effects of the present disclosure include, among other things, identifying a change in capacitance of a power capacitor due to normal or abnormal aging. In some cases, such changes in capacitance may be detected in real time or near real time before catastrophic failures in the power capacitor can occur. As a result, reliability of power electronic systems may be improved, since failures can be avoided and preventive maintenance can be carried out at an optimal time, maximizing the availability of redundant systems.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A system comprising:
   a plurality of voltage sensors to measure a plurality of voltage differences across a plurality of phases of a power capacitor;
   a plurality of current sensors to measure a plurality of currents across the plurality of phases of the power capacitor; and
   data processing circuitry to determine a first error signal indicating of a difference between a nominal capacitance of the power capacitor and an actual value of the power capacitor based at least in part on a difference between (1) a sum of the currents across the plurality of phases of the power capacitor and (2) an expected sum of the currents across the plurality of phases of the power capacitor, wherein the data processing circuitry is configured to determine the expected sum of the currents across the plurality of phases of the power capacitor based at least in part on a sum of a derivative of the measured voltage differences across the plurality of phases of the power capacitor multiplied by the nominal capacitance, and wherein the data processing circuitry is configured to use the first error signal in a decision on preventive maintenance relating to the power capacitor.

2. The system of claim 1, wherein the plurality of voltage sensors and the plurality of current sensors are configured to operate in real time or near real time and the data processing circuitry is configured to determine the indication of the difference between the nominal capacitance of the power capacitor and the actual capacitance of the power capacitor in real time or near real time.

3. The system of claim 1, wherein the data processing circuitry is configured to determine the expected sum of the currents by multiplying the nominal capacitance by the derivative of the measured sum of the voltages, wherein the data processing circuitry is configured to estimate the derivative of the measured voltages using a technique of a higher order than a first-order linear approximation.

4. The system of claim 1, wherein the data processing circuitry is configured to determine the expected sum of the currents by multiplying the nominal capacitance by the derivative of the measured sum of the voltages, wherein the data processing circuitry is configured to estimate the derivative of the measured sum of the voltages using voltage values output by a state controller that receives the measured sum of the voltages and an estimated feedback value of the measured sum of the voltages, wherein the data processing circuitry is configured to determine the estimated feedback value of the measured sum of the voltages by integrating the derivative of the measured sum of the voltages that was output by the state controller.

5. The system of claim 1, wherein the data processing circuitry is configured to determine the expected sum of the currents by multiplying the nominal capacitance by the derivative of the measured sum of the voltages, wherein data processing circuitry is configured to estimate the derivative of the measured sum of the voltages based at least in part on the following relationship:

$$\frac{dx^2}{dt}[k] \approx \frac{2x[k] - 3x[k-1] + x[k-2]}{T_E},$$

where x represents each measured voltage of the measured sum of the voltages at sampling times k occurring periodically at a period of $T_E$.

6. The system of claim 1, wherein the data processing circuitry is configured to determine the expected sum of the currents by multiplying the nominal capacitance by the derivative of the measured sum of the voltages, to filter the expected sum of the currents and the measured sum of the currents through respective low pass filters, and determine a difference between the expected sum of the currents and the measured sum of the currents to obtain a current error signal.

7. The system of claim 6, wherein the data processing circuitry is configured to integrate an absolute value of the current error signal over a period of time to obtain a capacitance error signal equal to the difference between the nominal capacitance and the actual capacitance.

8. An article of manufacture comprising:
   one or more tangible, machine-readable media at least collectively comprising machine-executable instructions, the instructions comprising:
   (a) instructions to receive a first voltage measurement across a first phase of a power capacitor, a second voltage measurement across a second phase of the power capacitor, and a third voltage measurement across a third phase of the power capacitor;
   (b) instructions to receive a total current measurement equal to a sum of all currents flowing across the first, second, and third phases of the power capacitor;
   (c) instructions to determine a first expected current by multiplying a nominal capacitance value of the first phase of the power capacitor by a derivative of the first voltage measurement;

(d) instructions to determine a second expected current by multiplying the nominal capacitance value of the second phase of the power capacitor by a derivative of the second voltage measurement;

(e) instructions to determine a third expected current by multiplying the nominal capacitance value of the third phase of the power capacitor by a derivative of the third voltage measurement;

(f) instructions to sum the first, second, and third expected currents to obtain a total expected current; and (g) instructions to compare the total expected current to the total current measurement to obtain an error signal related to differences between actual and nominal values of the power capacitor phases relative to one another; and (h) instructions to use the error signal in a decision on preventive maintenance relating to the power capacitor.

9. The article of manufacture of claim 8, wherein the instructions to determine the first, second, and third expected currents comprise respective instructions to determine the derivatives of the first, second, and third voltage measurements using an approximation of a higher order than first-order linear approximation.

10. The article of manufacture of claim 8, wherein the instructions to determine the first, second, and third expected currents comprise respective instructions to determine the derivatives of the first, second, and third voltage measurements using an approximation obtained based at least in part on the following relationship:

$$\frac{dx^2}{dt}[k] \approx \frac{2x[k] - 3x[k-1] + x[k-2]}{T_E},$$

where x represents the first, second, or third voltage measurements obtained at sampling times k occurring periodically at a period of $T_E$.

11. The article of manufacture of claim 8, comprising instructions to carry out the instructions in the recited order.

12. The article of manufacture of claim 8, comprising instructions to repeat the instructions of (a)-(g) a plurality of times in a period of time to obtain a respective plurality of error signals and summing absolute values of the plurality of error signals to obtain an unbalance index, wherein the unbalance index indicates a difference between actual and nominal capacitances of the three respective phases of the power capacitor.

13. The article of manufacture of claim 12, wherein the period of time comprises one or a multiple of one fundamental frequency of alternating current power associated with the power capacitor.

14. The article of manufacture of claim 12, wherein the instructions to repeat the instructions of (a)-(g) the plurality of times in the period of time comprises instructions to repeat the instructions of (a)-(g) between approximately 50 to 200 times the fundamental period of the alternating current power.

15. The article of manufacture of claim 12, comprising instructions to provide an indication that preventive maintenance is called for when the unbalance index exceeds a threshold.

16. A method comprising:

measuring at least one voltage and at least one current associated with at least one phase of a power capacitor using at least one voltage sensor and at least one current sensor;

determining, using a processor, an error signal related to a difference between an actual capacitance and a nominal capacitance of the power capacitor based at least in part on the at least one measured voltage and the at least one measured current; and using the indication of the difference in a decision carried out in the processor on preventive maintenance relating to the power capacitor;

wherein the method comprises:

(a) receiving, using the processor, the at least one voltage across the at least one phase of the power capacitor, a second voltage across a second phase of the power capacitor, and a third voltage across a third phase of the power capacitor;

(b) receiving, using the processor, a total current measurement equal to a sum of the current across the at least one phase of the power capacitor, a current across the second phase of the power capacitor, and a current across the third phase of the power capacitor;

(c) determining, using the processor, a first expected current by multiplying the nominal capacitance value of the first phase of the power capacitor by a derivative of the at least one voltage measurement;

(d) determining, using the processor, a second expected current by multiplying the nominal capacitance value of the second phase of the power capacitor by a derivative of the second voltage measurement;

(e) determining, using the processor, a third expected current by multiplying the nominal capacitance value of the third phase of the power capacitor by a derivative of the third voltage measurement;

(f) summing, using the processor, the first, second, and third expected currents to obtain a total expected current;

(g) comparing, using the processor, the total expected current to the total current measurement to obtain an error signal related to differences between actual and nominal values of the power capacitor phases relative to one another; and (h) using the error signal in the decision on preventive maintenance relating to the power capacitor via the processor.

17. The method of claim 16, wherein determining the error signal comprises determining a difference between an expected instantaneous current and the measured current, wherein the measured current comprises a measured instantaneous current, wherein the expected instantaneous current represents an instantaneous current that would be expected to flow across the at least one phase of the power capacitor at the time the measured instantaneous current was measured.

18. The method of claim 16, wherein the value related to the error signal comprises a summation of absolute values of error signals obtained over a period of time, wherein each of the error signals represents an instantaneous error signal.

19. The method of claim 16, wherein the method is performed using one or more tangible, machine-readable media at least collectively comprising machine-executable instructions configured to be executed using the processor.

20. The method of claim 16, wherein using the indication of the difference comprises, when the error signal or a value related to the error signal exceeds a threshold, outputting by the processor an indication that preventive maintenance on the power capacitor is called for.

* * * * *